United States Patent
Aga

(10) Patent No.: US 11,244,851 B2
(45) Date of Patent: Feb. 8, 2022

(54) METHOD FOR MANUFACTURING SOI WAFER

(71) Applicant: SHIN-ETSU HANDOTAI CO., LTD., Tokyo (JP)

(72) Inventor: Hiroji Aga, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 11 days.

(21) Appl. No.: 16/621,001

(22) PCT Filed: May 30, 2018

(86) PCT No.: PCT/JP2018/020640
§ 371 (c)(1),
(2) Date: Dec. 10, 2019

(87) PCT Pub. No.: WO2018/235548
PCT Pub. Date: Dec. 27, 2018

(65) Prior Publication Data
US 2020/0111701 A1    Apr. 9, 2020

(30) Foreign Application Priority Data
Jun. 23, 2017   (JP) .............................. JP2017-123117

(51) Int. Cl.
*H01L 21/02*   (2006.01)
*H01L 21/762*  (2006.01)
*H01L 21/687*  (2006.01)

(52) U.S. Cl.
CPC .. *H01L 21/76243* (2013.01); *H01L 21/02236* (2013.01); *H01L 21/02334* (2013.01); *H01L 21/68764* (2013.01)

(58) Field of Classification Search
CPC .................... H01L 21/02223; H01L 21/02225
See application file for complete search history.

(56) References Cited

U.S. PATENT DOCUMENTS

2004/0087042 A1* 5/2004 Ghyselen ................ H01L 22/20
                                                        438/5
2007/0095799 A1* 5/2007 Matsuzawa ....... H01L 21/67253
                                                        219/121.4
(Continued)

FOREIGN PATENT DOCUMENTS

EP         2192610 A2    6/2010
JP       H07-050234 A    2/1995
(Continued)

OTHER PUBLICATIONS

Aug. 14, 2018 International Search Report issued in International Patent Application No. PCT/JP2018/020640.
(Continued)

*Primary Examiner* — Jae Lee
(74) *Attorney, Agent, or Firm* — Oliff PLC

(57) ABSTRACT

A method for manufacturing an SOI wafer by performing a sacrificial oxidation treatment and reducing a thickness of an SOI layer of the SOI wafer, in which: the SOI wafer on which the sacrificial oxidation treatment is performed has a film thickness distribution with a one-way sloping shape; a thermal oxidation in the sacrificial oxidation treatment is performed by combining a non-rotating oxidation and a rotating oxidation, using a vertical heat treatment furnace; whereby a thermal oxide film having an oxide film thickness distribution with a one-way sloping shape canceling the film thickness distribution with a one-way sloping shape of the SOI layer, is formed on a surface of the SOI layer; and by removing the formed thermal oxide film, an SOI wafer having an SOI layer whose film thickness distribution with a one-way sloping shape has been resolved is manufactured.

5 Claims, 4 Drawing Sheets

(56) References Cited

U.S. PATENT DOCUMENTS

| | | |
|---|---|---|
| 2010/0129941 A1 | 5/2010 | Okita |
| 2014/0329372 A1 | 11/2014 | Aga et al. |
| 2016/0372361 A1 | 12/2016 | Mohamed et al. |
| 2017/0287697 A1 | 10/2017 | Aga et al. |

FOREIGN PATENT DOCUMENTS

| | | |
|---|---|---|
| JP | 2007-242972 A | 9/2007 |
| JP | 2013-125909 A | 6/2013 |
| JP | 2016-066692 A | 4/2016 |

OTHER PUBLICATIONS

Feb. 17, 2021 Extended European Search Report issued in European Patent Application No. 18820765.8.
Nov. 10, 2021 Office Action issued in Taiwanese Patent Application No. 107119237.

* cited by examiner

[FIG. 1]
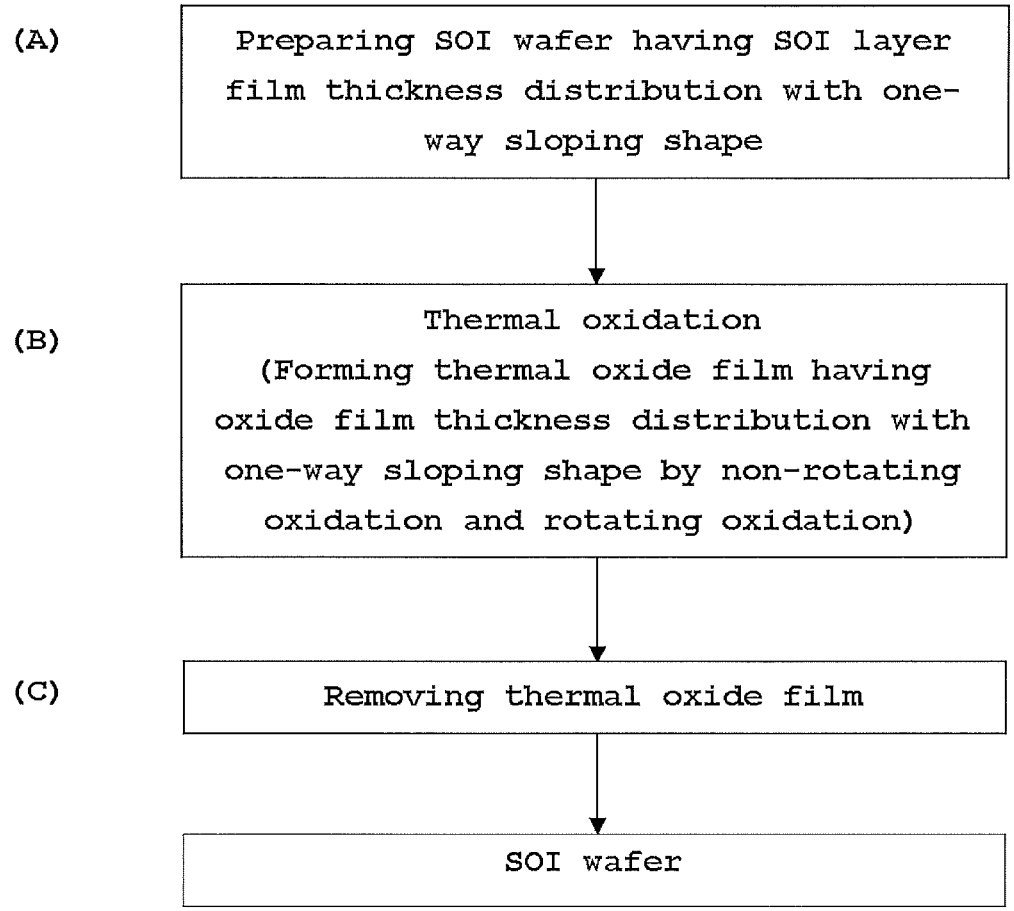

[FIG. 2]
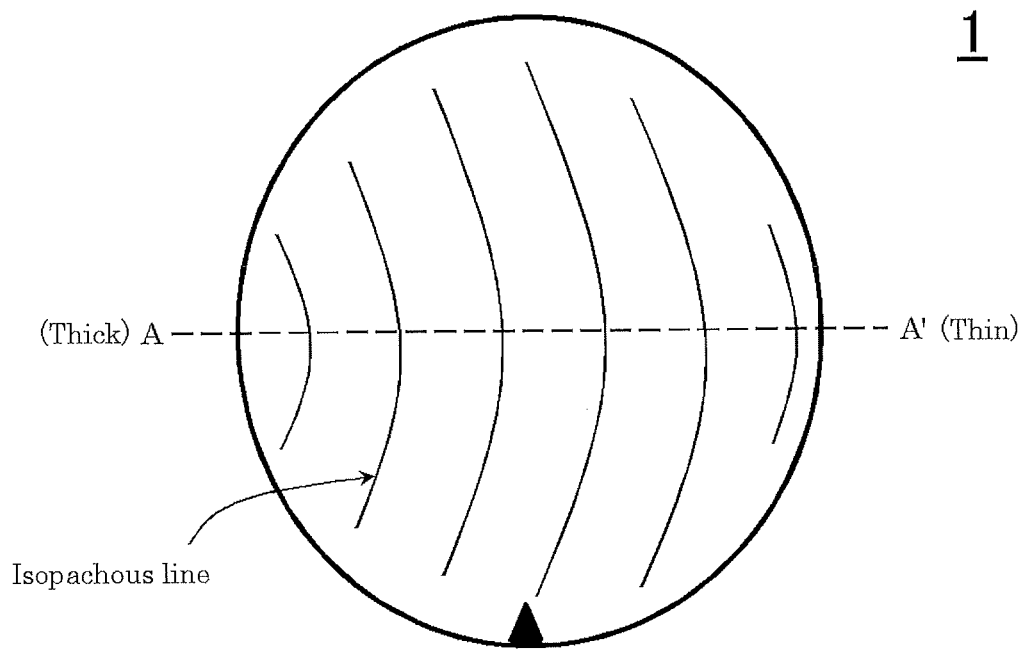

[FIG. 3]
Cross section A-A'
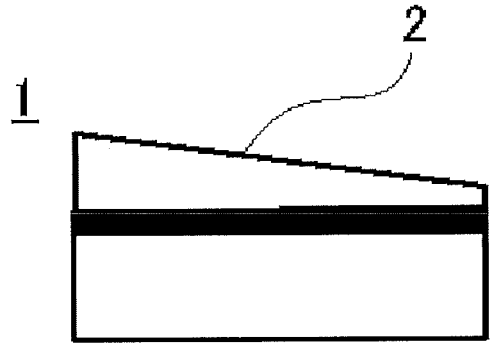
(A) Preparing SOI wafer having SOI layer film thickness distribution with one-way sloping shape
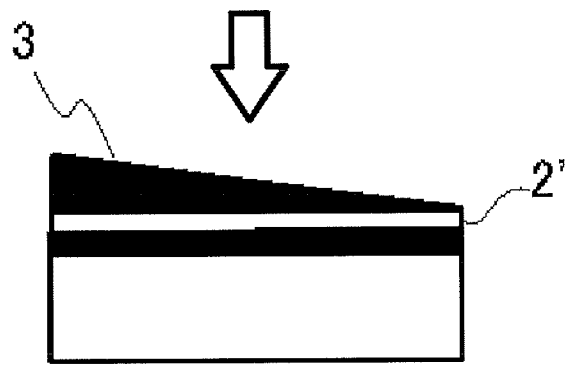
(B) Forming thermal oxide film having oxide film thickness distribution with one-way sloping shape
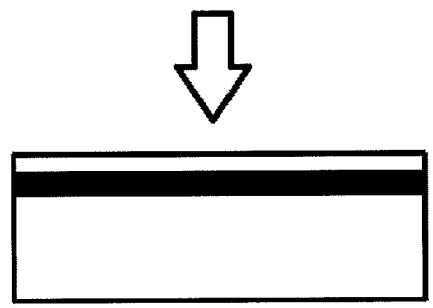
(C) Removing thermal oxide film

[FIG. 4]
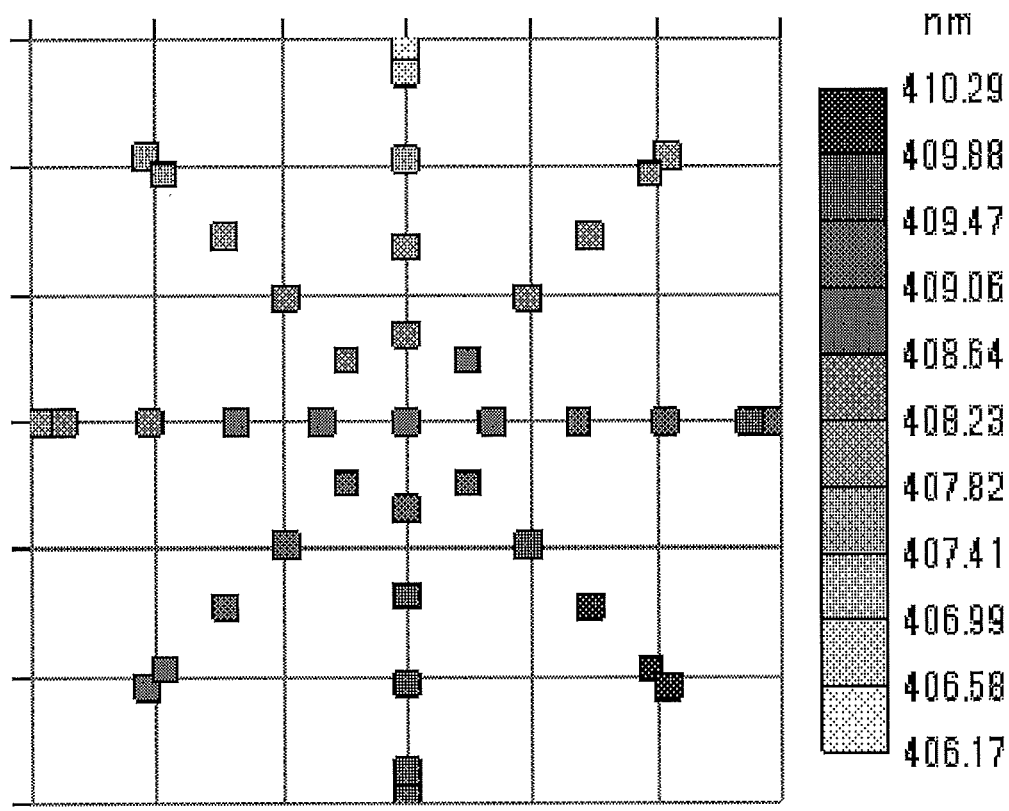

METHOD FOR MANUFACTURING SOI WAFER

TECHNICAL FIELD

The present invention relates to a method for manufacturing an SOI wafer.

BACKGROUND ART

When fabricating an SOI wafer by an ion implantation delamination method, in order to reduce a surface roughness of a delaminated surface while maintaining uniformity of a film thickness of an SOI layer immediately after delamination, a flattening heat treatment which improves surface roughness by performing a high-temperature heat treatment has come to be performed instead of polishing.

After a flattening heat treatment, normally, a sacrificial oxidation treatment to adjust the SOI layer to a desired film thickness is performed, and in the sacrificial oxidation, as a thermal oxidation furnace that can obtain an oxide film thickness with an excellent radial distribution, a vertical heat treatment furnace capable of performing a thermal oxidation while rotating a wafer is generally used.

In the flattening heat treatment for improving surface roughness, the greatest advantage is that the uniformity of the film thickness of the SOI layer is not degraded compared to flattening by polishing (touch polishing), but even with the flattening heat treatment, since etching of the SOI layer progresses slightly, compared to the uniformity of the film thickness immediately after delamination, a certain amount of degradation is unavoidable.

When the film thickness distribution of the SOI layer immediately after the flattening heat treatment is in a concentric circle shape, film thickness distribution of the SOI layer can be improved by the sacrificial oxidation treatment after the flattening heat treatment by adopting a method disclosed in Patent Document 1.

In Patent Document 1, it is disclosed that, regarding an SOI film thickness distribution with a concentric circle shape, by performing the thermal oxidation in the sacrificial oxidation treatment during a temperature rise or a temperature fall or both using a batch processing type heat treatment furnace with a wafer rotary mechanism, an oxide film thickness distribution in a concentric circle shape is formed, thereby canceling the SOI film thickness distribution and thereby improving the SOI film thickness distribution.

In addition, in Patent Document 2, it is disclosed that the film thickness distribution of the SOI layer is measured, and based on a predetermined radial stock removal distribution in the thinning step, the thinning is performed in a state in which the wafer is rotated and positioned so that the film thickness distribution of the SOI layer will be improved after the thinning step. However, the thinning step in question is an SC-1 cleaning.

In addition, in Patent Document 3, it is disclosed that, before performing a thermal oxidation treatment on the SOI layer, a radial film thickness distribution is measured, and based on the measured value, the thermal oxidation treatment is performed with a lamp output adjusted so that a radial temperature of the SOI layer is high in an area where the SOI layer film thickness is thick compared to an area where the SOI layer film thickness is thin.

CITATION LIST

Patent Literature

Patent Document 1: Japanese Unexamined Patent Application Publication No. 2013-125909

Patent Document 2: Japanese Unexamined Patent Application Publication No. 2016-66692

Patent Document 3: Japanese Unexamined Patent Application Publication No. 2007-242972

SUMMARY OF INVENTION

Technical Problem

As stated above, when a film thickness distribution of an SOI layer immediately after performing a flattening heat treatment is in a concentric circle shape, by applying a method disclosed in Patent Document 1, the film thickness distribution of the SOI layer can be improved with a sacrificial oxidation treatment after the flattening heat treatment.

On the other hand, it has been revealed that, depending on temperature distribution characteristics etc. of a heat treatment furnace in which the flattening heat treatment is performed, the film thickness distribution of the SOI layer after the flattening heat treatment sometimes has a one-way sloping shape (a shape in which an SOI film thickness slopes in a particular direction).

Even when the SOI layer having a film thickness distribution with such a one-way sloping shape is subjected to a sacrificial oxidation treatment in which a wafer is rotated and an oxide film with a good radial distribution is formed using a vertical heat treatment furnace having a rotary mechanism, the film thickness distribution of the SOI layer cannot be improved by the sacrificial oxidation treatment since the one-way sloping shape of the SOI layer remains.

The present invention has been accomplished in view of the above-described problems. It is an object of the present invention to provide a method for manufacturing an SOI wafer having an SOI layer whose film thickness distribution with a one-way sloping shape has been resolved by performing a sacrificial oxidation treatment on the SOI wafer having an SOI layer film thickness distribution with the one-way sloping shape.

Solution to Problem

To solve the above problems, the present invention provides, a method for manufacturing an SOI wafer by performing a sacrificial oxidation treatment which includes performing a thermal oxidation of an SOI layer surface of an SOI wafer and removing a formed thermal oxide film in order to reduce a thickness of the SOI layer of the SOI wafer, wherein:

the SOI layer of an SOI wafer on which the sacrificial oxidation treatment is performed has a film thickness distribution with a one-way sloping shape, sloping in a particular direction;

a thermal oxidation in the sacrificial oxidation treatment is performed by combining a non-rotating oxidation wherein a thermal oxidation is performed without rotating the SOI wafer and a rotating oxidation wherein a thermal oxidation is performed while rotating the SOI wafer, using a vertical heat treatment furnace having a mechanism to rotate a wafer surface in a horizontal direction; whereby a thermal oxide film having an oxide film thickness distribution with a one-way sloping shape canceling the film thickness distribution with a one-way sloping shape of the SOI layer, is formed on a surface of the SOI layer; and by removing the formed thermal oxide film, an SOI wafer having an SOI layer whose film thickness distribution with a one-way sloping shape has been resolved is manufactured.

Such a method for manufacturing an SOI wafer can form an oxide film thickness distribution with a one-way sloping shape that corresponds to the one-way sloping shape of the SOI layer by the thermal oxidation in the sacrificial oxidation treatment, and as a result, the film thickness distribution with the one-way sloping shape of the SOI layer can be canceled, and an SOI wafer having an SOI layer whose film thickness distribution with a one-way sloping shape has been resolved can be manufactured.

In addition, in this case, as the thermal oxidation in the sacrificial oxidation treatment, it is preferable to perform the rotating oxidation after performing the non-rotating oxidation.

Thus, by performing the non-rotating oxidation and then switching to the rotating oxidation, an oxide film thickness distribution with a one-way sloping shape that corresponds to the one-way sloping shape of the SOI layer can be formed easily, and therefore, it is preferable.

In addition, in this case, the SOI wafer with the SOI layer having a film thickness distribution with the one-way sloping shape can be fabricated by adding a flattening heat treatment for flattening the SOI layer surface which was delaminated at the ion implanted layer by an ion implantation delamination method.

Thus, as the SOI wafer to be subjected to the sacrificial oxidation treatment, an SOI wafer whose SOI layer came to have a film thickness distribution with a one-way sloping shape as a result of adding the flattening heat treatment after the delamination by the ion implantation delamination method can be used.

Advantageous Effects of Invention

The inventive method for manufacturing an SOI wafer can, by performing a thermal oxidation in the sacrificial oxidation treatment, combining a non-rotating oxidation and a rotating oxidation, form an oxide film thickness distribution with a one-way sloping shape that corresponds to the one-way sloping shape of the SOI layer, and as a result, the SOI layer film thickness distribution can be canceled, and an SOI wafer having an SOI layer whose film thickness distribution with a one-way sloping shape has been resolved can be manufactured.

BRIEF DESCRIPTION OF DRAWINGS

FIG. 1 is a flow diagram showing an example of the inventive method for manufacturing an SOI wafer.

FIG. 2 is a diagram showing an example of an SOI wafer whose SOI layer has a film thickness distribution with a one-way sloping shape, sloping in a particular direction which is subjected to a sacrificial oxidation treatment in the present invention.

FIG. 3 shows cross section A-A' after each step in the inventive method for manufacturing an SOI wafer when the SOI wafer shown in FIG. 2 is used as the SOI wafer to be subjected to the sacrificial oxidation treatment.

FIG. 4 is a diagram showing an oxide film thickness distribution formed on the monitor wafer by only a non-rotating oxidation in the vertical heat treatment furnace used in Examples and Comparative Examples.

DESCRIPTION OF EMBODIMENTS

As stated above, even when the SOI layer having a film thickness distribution with such a one-way sloping shape is subjected to a sacrificial oxidation treatment in which a wafer is rotated and an oxide film with a good radial distribution is formed using a vertical heat treatment furnace having a rotary mechanism, the film thickness distribution of the SOI layer cannot be improved by the sacrificial oxidation treatment since the one-way sloping shape of the SOI layer remains.

The present inventor has studied diligently to solve the above problem and consequently found that, when an SOI wafer having an SOI layer film thickness distribution with a one-way sloping shape is subjected to a sacrificial oxidation using a vertical heat treatment furnace having a wafer rotary mechanism, by combining a non-rotating oxidation in which a thermal oxidation is performed without rotating the wafer and a rotating oxidation in which a thermal oxidation is performed while rotating the wafer, a thermal oxide film having an oxide film thickness distribution with a one-way sloping shape that cancels the SOI layer film thickness distribution is formed on the surface of the SOI layer, thereby, after the sacrificial oxidation treatment, an SOI wafer having an SOI layer whose film thickness distribution with a one-way sloping shape has been resolved can be manufactured, and arrived at the present invention.

That is, the present invention provides a method for manufacturing an SOI wafer by performing a sacrificial oxidation treatment which includes performing a thermal oxidation of an SOI layer surface of an SOI wafer and removing a formed thermal oxide film in order to reduce a thickness of the SOI layer of the SOI wafer, wherein:

the SOI layer of an SOI wafer on which the sacrificial oxidation treatment is performed has a film thickness distribution with a one-way sloping shape, sloping in a particular direction;

a thermal oxidation in the sacrificial oxidation treatment is performed by combining a non-rotating oxidation wherein a thermal oxidation is performed without rotating the SOI wafer and a rotating oxidation wherein a thermal oxidation is performed while rotating the SOI wafer, using a vertical heat treatment furnace having a mechanism to rotate a wafer surface in a horizontal direction;

whereby a thermal oxide film having an oxide film thickness distribution with a one-way sloping shape canceling the film thickness distribution with a one-way sloping shape of the SOI layer, is formed on a surface of the SOI layer; and by removing the formed thermal oxide film, an SOI wafer having an SOI layer whose film thickness distribution with a one-way sloping shape has been resolved is manufactured.

Hereinafter, the inventive method for manufacturing an SOI wafer will be described. A flow diagram showing an example of the inventive method for manufacturing an SOI wafer is shown in FIG. 1.

In the present invention, first, as the SOI wafer on which the sacrificial oxidation treatment is to be performed, an SOI wafer 1 with an SOI layer 2 having a film thickness distribution with a one-way sloping shape, sloping in a particular direction is prepared (FIG. 1(A), FIG. 3(A)). For example, an SOI wafer 1 having an SOI layer film thickness distribution with a one-way sloping shape having isopachous lines as shown in FIG. 2 can be used. It is to be noted that FIG. 3 shows diagrams of cross section A-A' after each step when the SOI wafer 1 shown in FIG. 2 is used.

A method for fabricating an SOI wafer 1 having such an SOI layer 2 with a film thickness distribution with a one-way sloping shape is not particularly limited, but an SOI wafer whose SOI layer came to have a film thickness distribution with a one-way sloping shape as a result of flattening, by a high-temperature long-duration flattening heat treatment, a delaminated surface of the SOI wafer which was delaminated by an ion implantation delamination method, may be used.

As a high-temperature heat treatment furnace for performing such a flattening heat treatment, one that is not provided with a wafer rotary mechanism may be used. Since the SOI layer after the flattening heat treatment comes to have a one-way sloping shape depending on conditions such as furnace temperature distribution and heat treatment conditions etc., a heat treatment furnace and heat treatment conditions in which an SOI layer film thickness distribution with a one-way sloping shape is formed are noted experimentally in advance.

In addition, after the delamination at the ion implanted layer and before the flattening heat treatment, a sacrificial oxidation is often performed as a bonding heat treatment with the object of enhancing a bonding strength while removing the damage on the ion implanted layer. In such a case, the SOI layer immediately after the delamination sometimes comes to have a film thickness distribution with a one-way sloping shape depending on implanting conditions such as an implantation angle (offset angle) at the time of the ion implantation. In such a case, the sacrificial oxidation treatment in the present invention may be applied to the sacrificial oxidation as the bonding heat treatment.

In addition, when the flatting is performed by polishing (touch polishing), depending on polishing conditions, the SOI layer immediately after polishing sometimes has a film thickness distribution with a one-way sloping shape. In such a case, the SOI wafer after polishing may be used as the SOI wafer 1 whose SOI layer 2 came to have a film thickness distribution with a one-way sloping shape.

Subsequently, the sacrificial oxidation treatment is performed on the SOI wafer 1 with an SOI layer 2 having a film thickness distribution with a one-way sloping shape, sloping in a particular direction. The sacrificial oxidation treatment is performed by a thermal oxidation (FIG. 1(B)) and removal of the thermal oxide film (FIG. 1(C)).

The thermal oxidation (FIG. 1(B)) in the sacrificial oxidation treatment of the present invention is performed using a vertical heat treatment furnace having a wafer rotary mechanism.

In the present invention, using an oxidation furnace having a rotary mechanism to be used, a non-rotating oxidation is performed using a monitor wafer and the oxide film thickness distribution caused by the non-rotating oxidation is measured beforehand, thereby a thermal oxide film having an oxide film thickness distribution with a one-way sloping shape that corresponds to the one-way sloping shape of the SOI layer can be formed accurately.

The thermal oxidation in the sacrificial oxidation treatment of the present invention can, by combining a non-rotating oxidation in which a thermal oxidation is performed without rotating the SOI wafer and a rotating oxidation in which a thermal oxidation is performed while rotating the SOI wafer, form a thermal oxide film 3 having an oxide film thickness distribution with a one-way sloping shape on a surface of an SOI layer 2' ((FIG. 1(B), FIG. 3(B)). It is to be noted that the order of the non-rotating oxidation and the rotating oxidation is not particularly limited, but a method of performing the non-rotating oxidation first and then switching to the rotating oxidation is simple and favorable.

When the non-rotating oxidation is performed first, the film thickness distribution of the SOI layer 2 of the SOI wafer (the SOI wafer 1 having a film thickness distribution with a one-way sloping shape) to be subjected to the sacrificial oxidation treatment is measured beforehand, and the introduction direction of the wafer is rotated so that a part where the SOI layer film thickness is greatest (smallest) corresponds to a part where the oxide film thickness distribution of the monitor wafer is greatest (smallest), and then the SOI wafer is set into the wafer boat of the vertical heat treatment furnace.

The SOI wafer set into the wafer boat is introduced into the vertical heat treatment furnace (oxidation furnace), oxidation is performed for a certain period without rotation, and then, switching to a rotating oxidation, oxidation is performed for a certain period. The time when the non-rotating oxidation is switched to the rotating oxidation (that is, the oxidation duration of the non-rotating oxidation) can be experimentally determined taking the SOI layer film thickness distribution before oxidation into consideration so that the film thickness distribution of the SOI layer after the sacrificial oxidation treatment becomes smallest.

In addition, the order of the non-rotating oxidation and the rotating oxidation is not particularly limited in the present invention, and if the position in which to stop the wafer when beginning the non-rotating oxidation can be perceived, it is also possible to perform the non-rotating oxidation after the rotating oxidation, and they can also be repeated one after the other several times.

Next, by removing the formed thermal oxide film 3 (FIG. 1(C), FIG. 3(C)), an SOI wafer having an SOI layer whose film thickness distribution with a one-way sloping shape has been resolved is manufactured. The method for removing the thermal oxide film is not particularly limited, and a conventional method such as hydrofluoric acid cleaning can be used.

The present invention is particularly effective when a sacrificial oxidation treatment is performed for canceling the variation of an SOI layer with a radial range of about a few nm at most (typically 1 nm or less) which was formed by an ion implantation delamination method, than when the SOI layer film thickness distribution before oxidation is large to some extent.

It is to be noted that if a rotary mechanism is installed in a heat treatment furnace for performing the flattening heat treatment at a high temperature for a long duration, an SOI layer after the flattening heat treatment can be obtained in a near concentric circle shape, but with a heat treatment furnace for performing a heat treatment at a high temperature for a long duration that is not provided with a rotary mechanism, there is no danger of the cost of the device itself rising in connection to the installation of the rotary mechanism, and in addition, there is no danger of becoming liable to malfunctions etc. due to effects from deformation of a heat treatment tube etc. and therefore, it is favorable.

In contrast, with a vertical heat treatment furnace (oxidation furnace) used for the thermal oxidation in the sacrificial oxidation treatment, often, the heat treatment is normally performed at less than 1100° C., mainly at 1050° C. or less, and therefore a thermal load is small compared to the flattening heat treatment, and no technical problems arise from the installation of a rotary mechanism.

In addition, even when a heat treatment furnace with a rotary mechanism installed is used as the heat treatment furnace for performing the flattening heat treatment at a high temperature for a long duration, there is a possibility that a film thickness distribution with a one-way sloping shape is slightly formed depending on conditions such as furnace temperature distribution, deviation in the center of rotation, or heat treatment conditions etc. Even in such a case, it is possible to apply the present invention, and by applying the non-rotating oxidation for a relatively short time, obtain an adjusting effect of the SOI layer film thickness distribution.

EXAMPLE

Hereinafter, the present invention will be more specifically described with reference to Examples and Comparative Examples. However, the present invention is not limited to these Examples.

Example 1

<Fabrication of an SOI Wafer Having an SOI Layer Film Thickness Distribution with a One-Way Sloping Shape>

By forming an ion implanted layer on the surface of a below-described bond wafer (with a thermal oxide film) under the below-described ion implanting conditions, bonding to the surface of a below-described base wafer with the thermal oxide film interposed therebetween, and then performing a delaminating heat treatment under the below-described conditions and delaminating the bond wafer at the ion implanted layer, an SOI wafer having an SOI layer was fabricated, and by performing a bonding heat treatment and a flattening heat treatment on the SOI wafer under the below-described conditions, an SOI wafer was fabricated.
(Bond Wafer)
Si single crystal wafer, diameter: 300 mm, <100>, p type, 10 Ωcm
With thermal oxide film of 25 nm
(Base Wafer)
Si single crystal wafer, diameter: 300 mm, <100>,
(Ion Implanting Conditions)
$H^+$ ion, 50 keV, $6 \times 10^{16}/cm^2$
(Delaminating heat treatment) 500° C., 30 minutes, nitrogen atmosphere
(Bonding heat treatment) 1050° C., 1 hour, oxidizing atmosphere
(Flattening treatment) 1200° C., 3 hours, $H_2$ gas 100%

The SOI film thickness distribution after the flattening heat treatment was a one-way sloping distribution (a distribution in which the film thickness becomes thinner in a left to right direction with a notch at the bottom) as in FIG. 2, and a film thickness range (Max-Min) was 0.7 nm.
<Checking the Characteristics of a Vertical Heat Treatment Furnace in which the Sacrificial Oxidation is Performed>

In the sacrificial oxidation conditions (1000° C., pyrogenic oxidation, forming oxide film of about 410 nm) to perform on the above-described SOI wafer, a monitor wafer (Si single crystal wafer, diameter: 300 mm, <100>, p type, 10 Ωcm) was used to measure the oxide film thickness distribution formed only with the non-rotating oxidation. As a result, it was observed that the oxide film thickness range was about 5 nm, and the distribution form was, as in FIG. 4, in a one-way sloping shape, the oxide film thinning from the near side of the furnace towards the far side of the furnace.
<Performing a Sacrificial Oxidation: Non-Rotating Oxidation+Rotating Oxidation>

The SOI wafer was set into a wafer boat so that the thickest part of the SOI film thickness was at the near side of the furnace, and in this state, 30 minutes of non-rotating oxidation (1000° C., pyrogenic oxidation) was performed, immediately after which the wafer boat was rotated at a rotational speed of 1 rpm, and then 2 hours of rotating oxidation (1000° C., pyrogenic oxidation) were performed. After removing the oxide film on the surface of the SOI layer by immersing the SOI wafer after finishing the sacrificial oxidation in dilute hydrofluoric acid, the SOI layer film thickness distribution was measured. As a result, the film thickness distribution with a one-way sloping shape of the SOI layer was resolved, and the film thickness range (Max-Min) was improved to 0.5 nm.

Comparative Example 1

The sacrificial oxidation treatment was performed under the same conditions as Example 1 except that the sacrificial oxidation was performed with only a rotating oxidation (1 rpm), and the SOI layer film thickness distribution was measured. As a result, the film thickness distribution with a one-way sloping shape of the SOI layer was not resolved, and the film thickness range (Max-Min) had been degraded to 0.9 nm.

Example 2, Comparative Examples 2 to 4

The sacrificial oxidation treatment was performed under the same conditions as Example 1 except that the duration of the non-rotating oxidation and the rotating oxidation (1 rpm) in the sacrificial oxidation was set as shown in Table 1, and the SOI layer film thickness distribution was measured. In Example 2, resolution of the one-way sloping shape of the SOI layer had progressed compared to before the sacrificial oxidation treatment, the shape was almost uniform, and the film thickness range (Max-Min) had also been improved to 0.6 nm. In addition, in Comparative Examples 2 to 4, the one-way sloping shape had sloped in the opposite direction, having gone beyond canceling the film thickness distribution with the one-way sloping shape of the SOI layer, and the film thickness range (Max-Min) had also been degraded.

The film thickness range of the SOI wafer manufactured in Examples 1, 2, and Comparative Examples 1 to 4 and the SOI layer film thickness distribution shape are shown in Table 1.

TABLE 1

|  | Comparative Example 1 | Example 2 | Example 1 | Comparative Example 2 | Comparative Example 3 | Comparative Example 4 |
| --- | --- | --- | --- | --- | --- | --- |
| Duration of non-rotating oxidation (minutes) | 0 | 15 | 30 | 45 | 60 | 150 |
| Duration of rotating oxidation (minutes) | 150 | 135 | 120 | 105 | 90 | 0 |
| SOI film thickness range | 0.9 nm | 0.6 nm | 0.5 nm | 0.7 nm | 1.2 nm | 2.5 nm |
| SOI film thickness distribution shape | One-way sloping | Uniform | Uniform | One-way sloping | One-way sloping | One-way sloping |

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for manufacturing an SOI wafer by performing a sacrificial oxidation treatment which includes performing a thermal oxidation of an SOI layer surface of an SOI wafer and removing a formed thermal oxide film in order to reduce a thickness of the SOI layer of the SOI wafer, wherein:
   the SOI layer of an SOI wafer on which the sacrificial oxidation treatment is performed has a film thickness distribution with a one-way sloping shape, sloping in a particular direction;
   on a monitor wafer a first non-rotating oxidation is performed using a vertical heat treatment furnace having a mechanism to rotate a wafer surface in a horizontal direction and the oxide film thickness distribution caused by the first non-rotating oxidation is measured beforehand, then the thermal oxidation of the SOI layer surface of the SOI wafer in the sacrificial oxidation treatment is performed by combining
      a second non-rotating oxidation in which the thermal oxidation of the SOI layer surface of the SOI wafer occurs without rotating the SOI wafer and
      a rotating oxidation in which the thermal oxidation of the SOI layer surface of the SOI wafer occurs while rotating the SOI wafer,
   using the vertical heat treatment furnace having the mechanism to rotate a wafer surface in the horizontal direction;
      whereby a thermal oxide film having an oxide film thickness distribution with a one-way sloping shape canceling the film thickness distribution with a one-way sloping shape of the SOI layer, is formed on a surface of the SOI layer; and
      by removing the formed thermal oxide film, an SOI wafer having an SOI layer whose film thickness distribution with a one-way sloping shape has been resolved is manufactured.

2. The method for manufacturing an SOI wafer according to claim 1, wherein, as a thermal oxidation in the sacrificial oxidation treatment, the rotating oxidation is performed after the second non-rotating oxidation is performed.

3. The method for manufacturing an SOI wafer according to claim 1, wherein the SOI wafer with the SOI layer having a film thickness distribution with the one-way sloping shape is fabricated by adding a flattening heat treatment for flattening an SOI layer surface which was delaminated at the ion implanted layer by an ion implantation delamination method.

4. The method for manufacturing an SOI wafer according to claim 2, wherein the SOI wafer with the SOI layer having a film thickness distribution with the one-way sloping shape is fabricated by adding a flattening heat treatment for flattening an SOI layer surface which was delaminated at the ion implanted layer by an ion implantation delamination method.

5. The method for manufacturing an SOI wafer according to claim 1, wherein the SOI wafer whose SOI layer came to have a film thickness distribution with a one-way sloping shape is formed by a flattening heat treatment using a high-temperature heat treatment furnace not provided with a wafer rotary mechanism.

* * * * *